(12) United States Patent
Charny et al.

(10) Patent No.: US 7,477,521 B2
(45) Date of Patent: Jan. 13, 2009

(54) ISOLATING STRESS ON A PRINTED CIRCUIT BOARD

(75) Inventors: Mikhail Charny, Derwood, MD (US); David J. Royle, Rockville, MD (US)

(73) Assignee: Acterna LLC, Germantown, MD (US)

(*) Notice: Subject to any disclaimer, the term of this patent is extended or adjusted under 35 U.S.C. 154(b) by 0 days.

(21) Appl. No.: 12/103,992

(22) Filed: Apr. 16, 2008

(65) Prior Publication Data

US 2008/0285242 A1 Nov. 20, 2008

Related U.S. Application Data

(60) Provisional application No. 60/938,044, filed on May 15, 2007.

(51) Int. Cl.
*H05K 1/00* (2006.01)
(52) U.S. Cl. .................. 361/749; 361/748; 361/784; 361/785; 361/786; 174/260; 174/250
(58) Field of Classification Search .......... 361/749, 361/748, 789, 788, 784–786; 439/66, 91, 439/591, 75, 83, 55, 65, 71, 70, 77, 67
See application file for complete search history.

(56) References Cited

U.S. PATENT DOCUMENTS

| 5,894,409 | A  | * | 4/1999  | Tanaka ............... 361/749 |
| 6,118,666 | A  | * | 9/2000  | Aoki et al. ........... 361/749 |
| 6,195,261 | B1 | * | 2/2001  | Babutzka et al. ...... 361/752 |
| 6,380,493 | B1 | * | 4/2002  | Morita et al. ......... 174/258 |
| 6,617,518 | B2 | * | 9/2003  | Ames et al. .......... 174/254 |
| 2005/0045374 | A1 | * | 3/2005 | Kumar et al. ......... 174/254 |
| 2006/0016618 | A1 | * | 1/2006 | Kim et al. ............ 174/255 |
| 2006/0285302 | A1 | * | 12/2006 | Kim ................. 361/749 |

* cited by examiner

*Primary Examiner*—Tuan T Dinh
*Assistant Examiner*—Hoa C Nguyen
(74) *Attorney, Agent, or Firm*—Allen, Dyer, Doppelt, Milbrath & Gilchrist, P.A., Attorneys at Law

(57) ABSTRACT

Printed circuit boards (PCB's) with edge connectors undergo bending stresses whenever the edge connectors are plugged into mating connectors. The bending stresses causes deformation of the printed circuit board, which can have deleterious effects on electrical components thereon. Slots are provided on the PCB to enable the portion of the PCB surrounding the edge connector to bend relative to the remainder of the PCB, thereby confine the bending to a localized area between the ends of the slots, and isolate the electrical components from any stresses caused thereby.

9 Claims, 4 Drawing Sheets

ISOLATING STRESS ON A PRINTED CIRCUIT BOARD

CROSS-REFERENCE TO RELATED APPLICATIONS

The present invention claims priority from U.S. Provisional Application No. 60/938,044, filed May 15, 2007, entitled "Isolating Stress On A Printed Circuit Board", by Chamy et al., which is incorporated herein by reference.

TECHNICAL FIELD

The present invention relates to localizing bending on a printed circuit board (PCB) for minimizing stress on components on the PCB, and in particular to the isolation of specific components on the PCB from bending stresses caused by the interconnection of an edge connector to a mating connector.

BACKGROUND OF THE INVENTION

Conventional printed circuit boards (PCB) 1 often include a PCB edge connector 2 to provide connectivity to adjacent or superposed PCBs or other electrical connectors. Spacers 3 with fasteners 4 are provided for separating the PCB 1 from adjacent mechanical components, e.g. housing, or other electrical components, e.g. other PCBs. In many cases, due to tolerance variations of supporting mechanical components and connectors, the connection of the electrical connectors 2 forces some displacement (see FIG. 1) of the connector 2, which causes bending of the PCB 1 located between lines 5 and 6. The amount of force applied permanently to connector 2 and the amount of bend are proportional to the amount of the displacement of the connector 2. Unfortunately, the bending of the PCB 1 is harmful to other components, such as ceramic capacitors, integrated circuits (IC's) in a ball grid array (BGA) and similar packages, and other electronic components in rigid packages.

Traditionally, designers used cables to eliminate PCB bend. The disadvantage of a cabled solution is that it adds complexity, reduces reliability, adds one or more additional connectors or soldered wires, and requires additional space which is not always available.

An object of the present invention is to overcome the shortcomings of the prior art by providing a PCB with a slot to ensure the PCB bends in a desired position, thereby isolating specific components on the PCB from stress and minimizing the harmful effects of the displacement of the PCB edge connector by localizing the area of the PCB bend.

SUMMARY OF THE INVENTION

Accordingly, the present invention relates to a printed circuit board device comprising:

a printed circuit board including a plurality of electrical components;

an edge connector mounted on a first edge of the printed circuit board, and electrically coupled to the plurality of electrical components via trace leads;

a first slot extending from an edge of the printed circuit board on one side of the edge connector to a first end; and a second slot extending from an edge of the printed circuit board on an opposite side of the edge connector to a second end;

wherein the first and second slots define an isolated area of the printed circuit board, which supports the edge connector, wherein the isolated area is connected to a main section of the printed circuit board, which supports the plurality of electrical components, via a neck, through which the trace leads extend; and wherein ends of the first and second slots define an axis about which the isolated area is bendable relative to the main section of the printed circuit board;

whereby any bending caused by the connection of the edge connector to a mating connector will be localized in the area between the first and second ends, thereby isolating the electrical components from any stresses caused thereby.

BRIEF DESCRIPTION OF THE DRAWINGS

The invention will be described in greater detail with reference to the accompanying drawings which represent preferred embodiments thereof, wherein.

DETAILED DESCRIPTION

Figure 1:
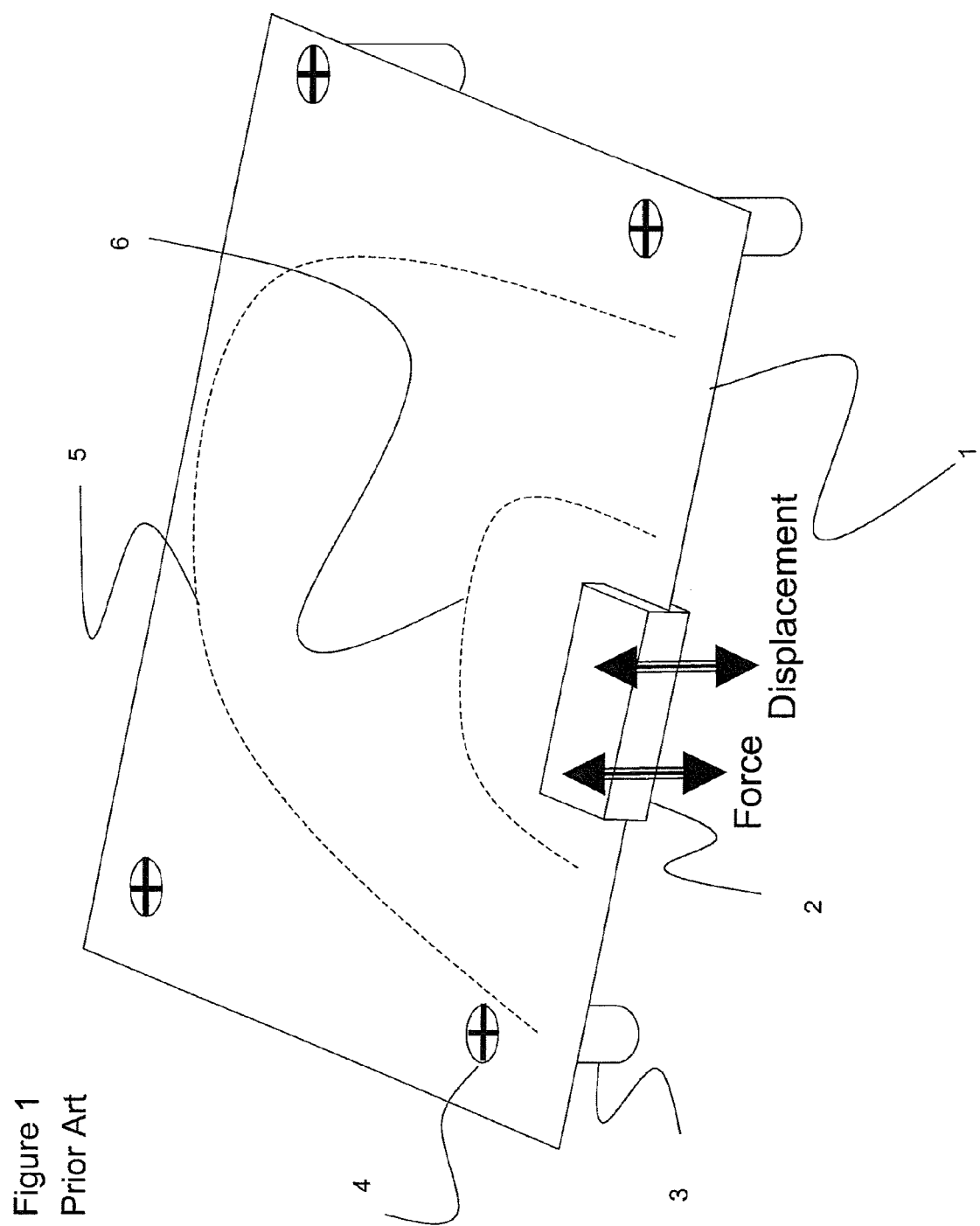
FIG. 1 is an isometric view of a conventional printed circuit board with an edge connector therein.
Figure 2:
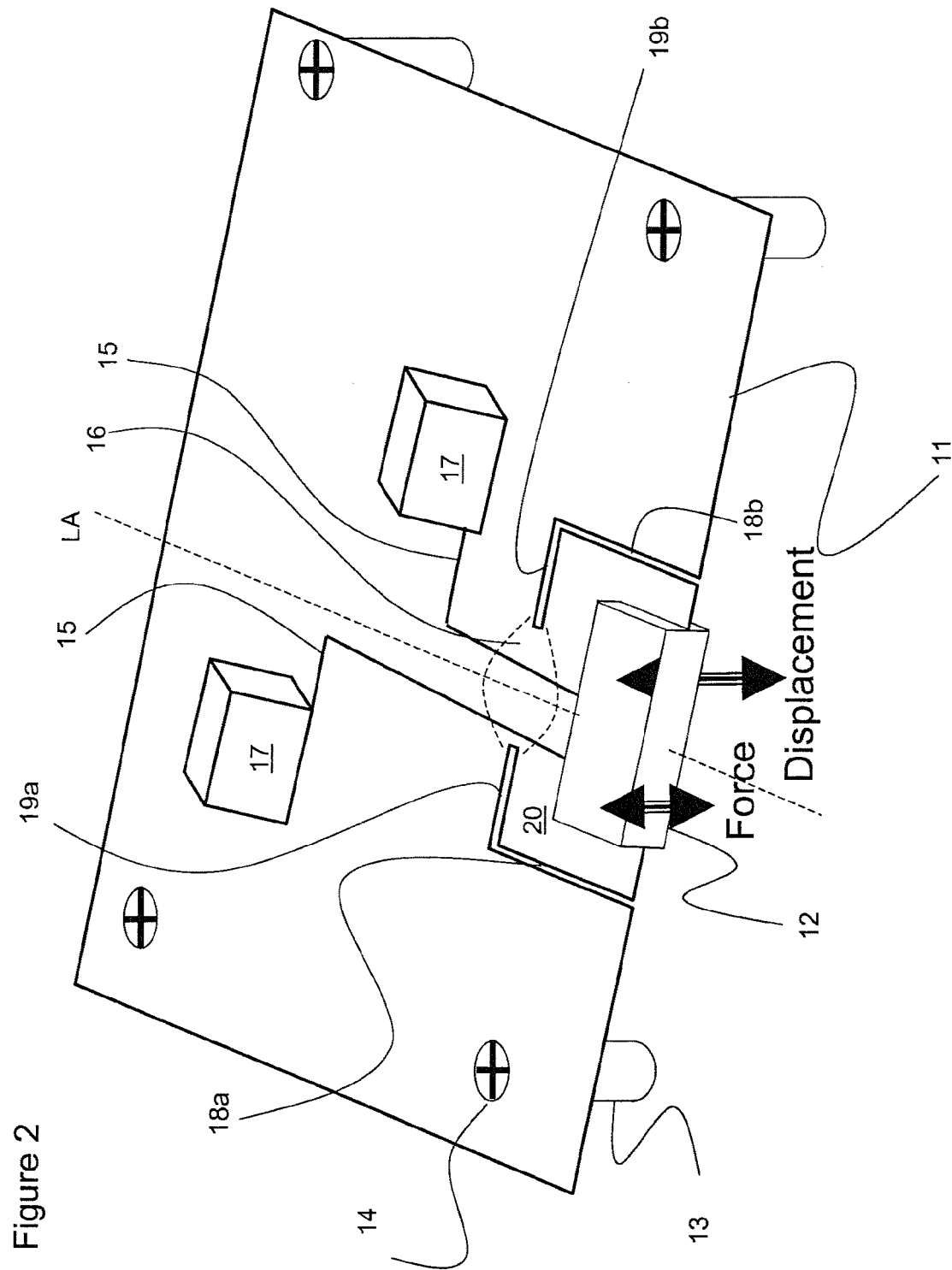
FIG. 2 is an isometric view of a printed circuit board with an edge connector in accordance with the present invention.

With reference to FIG. 2, a printed circuit board (PCB) 11, according to the present invention, includes an electrical, or other form of, edge connector 12 mounted on a first edge of the PCB 11 to provide connectivity to adjacent or superposed PCBs, and/or another electrical, or other form of, connector. Spacers 13 extend from the PCB 11 for separating the PCB 11 from adjacent mechanical, e.g. a housing, or electrical, e.g. other PCBs, components, and are connected to the PCB 11 with threaded fasteners 14 (or other suitable means). Electrical trace leads 15 extend from the edge connector 12 through a confined area or neck 16 to electrical or electro-optical components 17.

While the edge connector 12 is connected to other connectors, any bending of the PCB 11 is localized to the confined area 16 by providing, e.g. cutting, slots 18a, 18b, 19a and 19b in the PCB 11 adjacent to, e.g. surrounding, connector 12 in first (longitudinal) and second (lateral) perpendicular directions defining an isolated section 20, which includes the connector 12. The geometry of the slots 18 and 19 enables the isolated section 20 to bend relative to the remainder of the PCB 11, which contains components 17, and confines the area of the bend to the confined area 16, thereby isolating and protecting the components 17 from stress caused by the bending of the connector 12.

The longitudinal slots 18a and 18b extend from the first edge of the PCB 11, on either side of the connector 12, perpendicular to the direction of the applied force and resulting displacement, indicated by the arrows in FIG. 2. The lateral slots 19a and 19b localize any bending caused by the applied force to the confined area 16 between the ends thereof, and isolate the components 17, which are outside of the confined area 16, from the stress in the confined area 16 caused by the bending of the connector 12. The longitudinal slots 18a and 18b enable the isolated section 20 to bend relative the remainder of the PCB 11 about an axis extending between the ends of the longitudinal slots 18a and 18b and along the lateral slots 19a and 19b parallel to the first edge of the PCB 11.

The lateral slots 19a and 19b extend from the longitudinal slots 18a and 18b, substantially perpendicular thereto, whereby the closed ends of the slots 19a and 19b define the boundaries of the confined area 16. The lateral slots 19a and 19b enable the isolated section 20 to rotate slightly about a longitudinal axis LA parallel to the longitudinal slots 18a and 18b. When the lengths of the lateral slots 19a and 19b are significant, the bend of the PCB 11 is localized to the confined area 16 remote from the connector 12 and the components 17. When the lengths of slots 19a and 19b are equal to zero, the bend of the PCB 11 is localized between longitudinal slots 18a and 18b and extends longitudinally farther, e.g. to the connector 12. Accordingly, the slots 18a, 18b, 19a and 19b also reduce the force applied to connector 12 for the same displacement as compared to a solid PCB, thereby reducing stresses on the connector 12. The slots 18a, 18b, 19a and 19b are constrained to longitudinal and lateral directions, but can have any trajectory.

Figure 3:
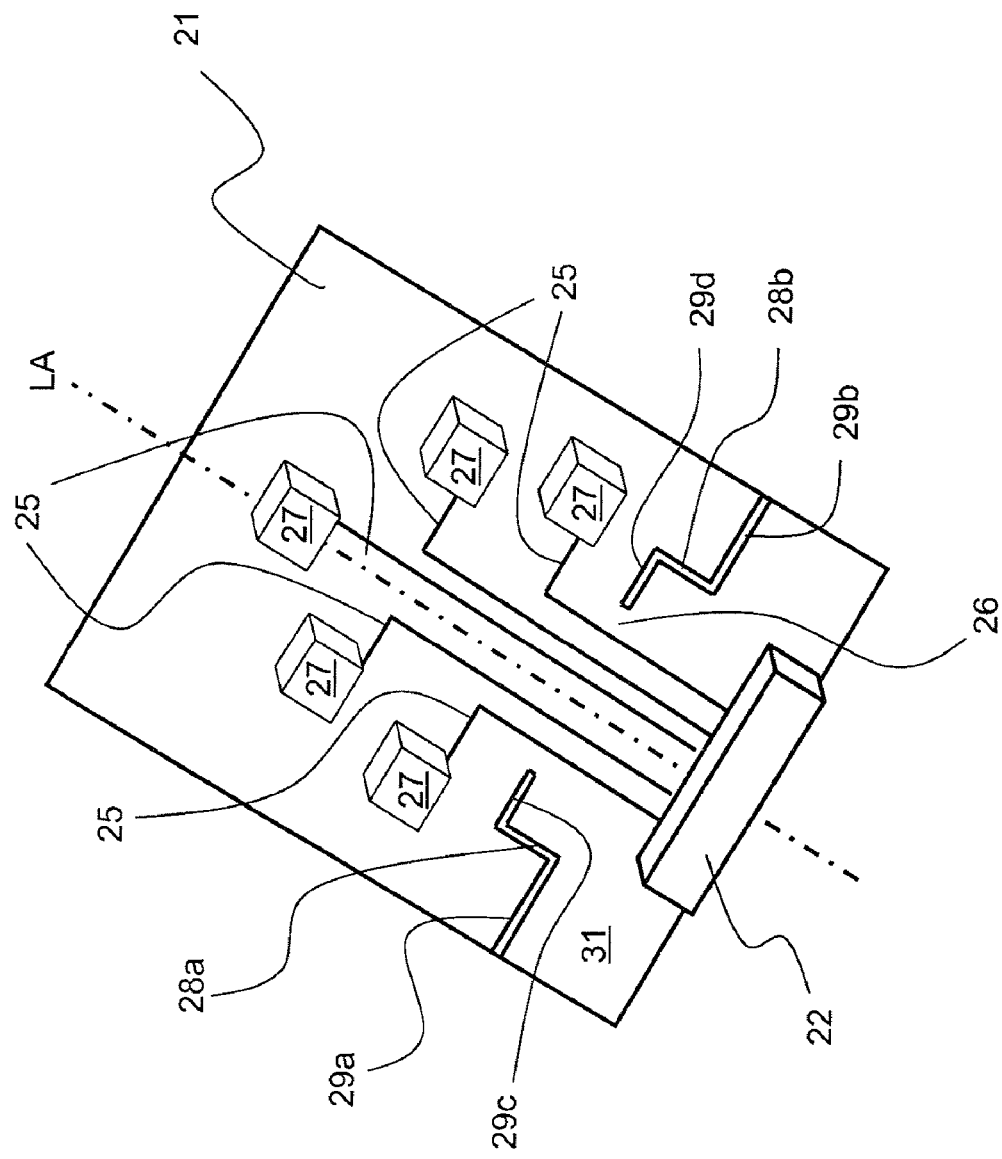
FIG. 3 is an isometric view of a printed circuit board with an edge connector in accordance with another embodiment of the present invention.

FIG. 3 illustrates another embodiment of the present invention in which a PCB 21 includes an electrical (or other form of) edge connector 22 mounted on a first edge thereof with electrical traces leads 25 extending therefrom through a neck or confined area 26 to electrical or electro-optic components 27. First lateral slots 29a and 29b extend from second and third sides of the PCB 21, respectively, which are substantially perpendicular to the first side (although other embodiments are within the scope of the invention), while longitudinal slots 28a and 28b extend perpendicularly from the ends of the first lateral slots 29a and 29b, respectively. Second lateral slots 29c and 29d extend perpendicularly from the ends of the longitudinal slots 28a and 28b, respectively, generally parallel to the first edge. The longitudinal and lateral slots 28a, 28b and 29a to 29d form an isolated section 31 with a stepped or saw toothed upper edge, which enables the isolated section 31 to rotate about an axis defined by second lateral slots 29c and 29d and the ends of the longitudinal slots 28a and 28b. The saw-toothed edges also enable the isolated section 31 to more easily rotate about a longitudinal axis LA. Moreover, the stepped edges minimizes the area of the isolated section 31 and thereby reduce the amount of bending stress applied to the confined area 26. Additional longitudinal and lateral slots are also within the scope of this invention, as well as slots extending at an acute angle to the longitudinal and lateral axes and edges, as illustrated in FIG. 4.

Figure 4:
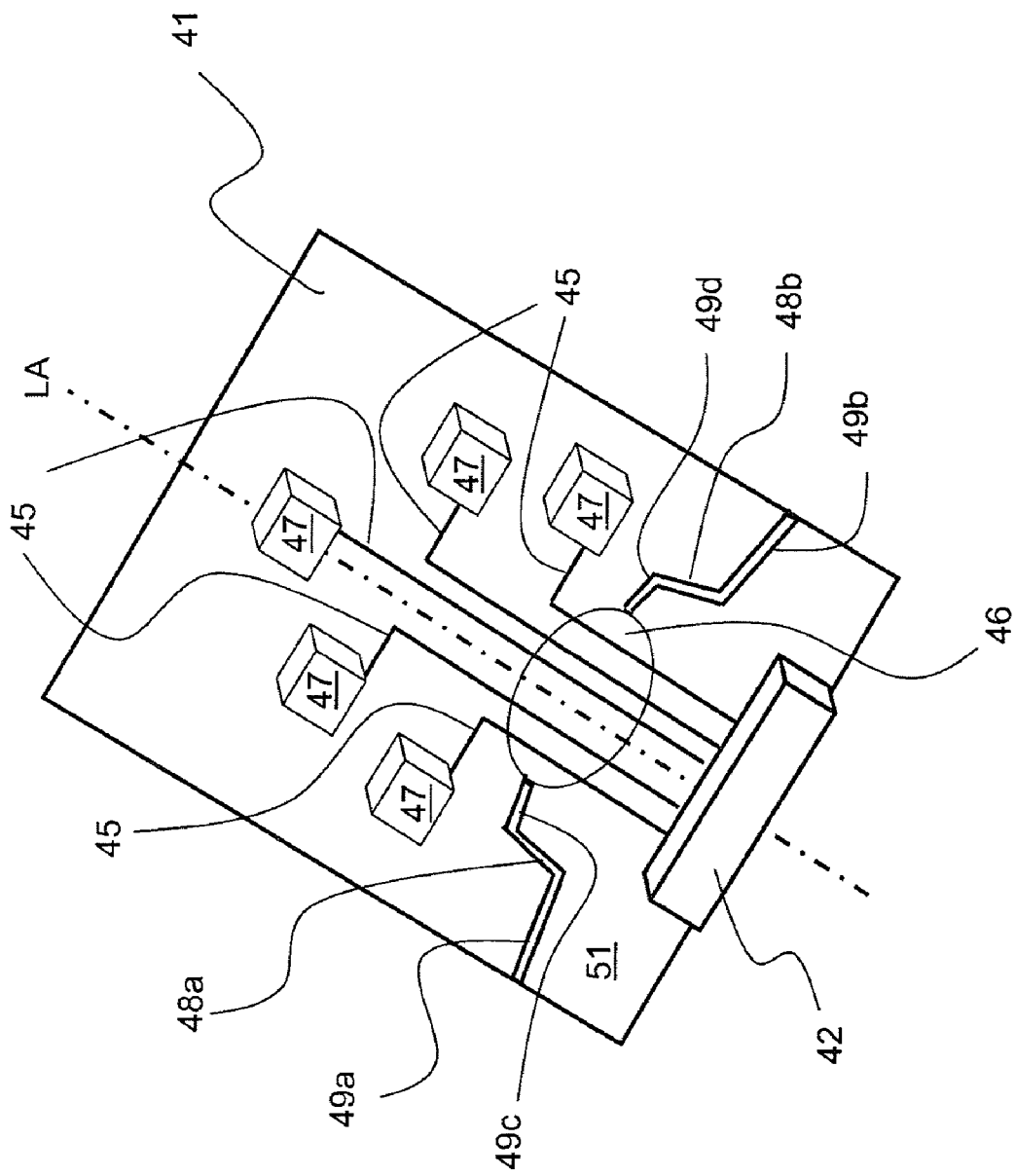
FIG. 4 is an isometric view of a printed circuit board with an edge connector in accordance with another embodiment of the present invention with angled slots.

FIG. 4 illustrates another embodiment of the present invention in which a PCB 41 includes an electrical (or other form of) edge connector 42 mounted on a first edge of the PCB 41 with electrical traces leads 45 extending therefrom through a neck or confined area 46 to electrical or electro-optic components 47. First lateral slot sections 49a and 49b extend from second and third sides of the PCB 41, respectively, which are substantially perpendicular to the first side (although other embodiments are within the scope of the invention), while longitudinal slot sections 48a and 48b extend from the ends of the first lateral slot sections 49a and 49b, respectively, at some angle, e.g. acute, obtuse or right angle. Second lateral slot sections 49c and 49d extend from the ends of the longitudinal slot sections 48a and 48b, respectively, generally parallel to the first slot sections 49a and 49b, but not necessarily. The second lateral slot sections 49c and 49d extend from the ends of the longitudinal slot sections 48a and 48b, respectively, at some angle, e.g. acute, obtuse or right angle. The longitudinal and lateral slot sections 48a, 48b and 49a to 49d form an isolated section 51 with a stepped or saw toothed upper edge, which enables the isolated section 51 to rotate about an axis defined by the ends of the second lateral slot sections 49c and 49d. The saw-toothed edges also enable the isolated section 51 to more easily rotate about a longitudinal axis LA. Moreover, the stepped edges minimizes the area of the isolated section 51 and thereby reduce the amount of bending stress applied to the confined area 46.

We claim:

1. A printed circuit board device comprising:
   a printed circuit board including a plurality of electrical components;
   an edge connector mounted on a first edge of the printed circuit board, and electrically coupled to the plurality of electrical components via trace leads;
   a first slot extending from an edge of the printed circuit board on one side of the edge connector to a first end; and
   a second slot extending from an edge of the printed circuit board on an opposite side of the edge connector to a second end;
   wherein the first and second slots define an isolated area of the printed circuit board, which supports the edge connector;
   wherein the isolated area is connected to a main section of the printed circuit board, which supports the plurality of electrical components, via a neck, through which the trace leads extend; and
   wherein ends of the first and second slots define an axis about which the isolated area is bendable relative to the main section of the printed circuit board;
   whereby any bending caused by the connection of the edge connector to a mating connector will be localized in the area between the first and second ends, thereby isolating the electrical components from any stresses caused thereby.

2. The device according to claim 1, wherein the first and second slots each include first and second perpendicular sections.

3. The device according to claim 2, wherein the first and second slots each also includes a third section parallel to the first section.

4. The device according to claim 1, wherein the first slot comprises a first section extending from the first edge adjacent to a first side of the edge connector;
   wherein the second slot comprises a first section extending from the first edge adjacent to a second side of the edge connector, whereby the first and second ends of the first and second slots, respectively, define an axis parallel to the first edge.

5. The device according to claim 4, wherein each of the first slots also includes a second section perpendicular to the first section.

6. The device according to claim 1, wherein the first slot extends from a second edge, and the second slot extends from a third edge, whereby the first and second ends define an axis parallel to the first end.

7. The device according to claim 6, wherein the first slot comprises a first section extending from the second edge, and a second section perpendicular to the first section thereof; and
   wherein the second slot comprises a first section extending from the third edge, and a second section perpendicular to the first section thereof.

8. The device according to claim 7, wherein the first slot also includes a third section parallel to the first section thereof; and
   wherein the second slot also includes a third section parallel to the first section thereof;
   whereby the isolated area of the printed circuit board is rotatable about perpendicular longitudinal and lateral axes.

9. The device according to claim 7, wherein the second section of the first slot extends at an acute angle from the first section of the first slot; and
   wherein the second section of the second slot extends at an acute angle from the first section of the second slot.

* * * * *